United States Patent
Ryu et al.

(10) Patent No.: US 7,899,103 B2
(45) Date of Patent: Mar. 1, 2011

(54) SIDE LIGHT EMITTING TYPE SEMICONDUCTOR LASER DIODE HAVING DIELECTRIC LAYER FORMED ON ACTIVE LAYER

(75) Inventors: Han-youl Ryu, Suwon-si (KR);
Kyoung-ho Ha, Seoul (KR)

(73) Assignee: Samsung LED Co., Ltd., Suwon-si, Gyeonggi-do (KR)

( * ) Notice: Subject to any disclaimer, the term of this patent is extended or adjusted under 35 U.S.C. 154(b) by 16 days.

(21) Appl. No.: 11/545,546

(22) Filed: Oct. 11, 2006

(65) Prior Publication Data

US 2007/0081570 A1    Apr. 12, 2007

(30) Foreign Application Priority Data

Oct. 12, 2005    (KR) .................. 10-2005-0096159

(51) Int. Cl.
*H01L 21/00*    (2006.01)

(52) U.S. Cl. ............. 372/45; 257/90; 257/102; 257/103; 257/E33.068; 257/E33.027; 372/43; 372/345; 372/456

(58) Field of Classification Search .................. 257/345, 257/372, 456, 96, 14, 102, 103, 744, E33.027, 257/E33.068; 372/43, 45, 345, 456; 438/22
See application file for complete search history.

(56) References Cited

U.S. PATENT DOCUMENTS

| | | | |
|---|---|---|---|
| 5,123,070 A * | 6/1992 | Bradley | 385/37 |
| 6,207,973 B1 * | 3/2001 | Sato et al. | 257/98 |
| 6,455,340 B1 * | 9/2002 | Chua et al. | 438/31 |
| 6,498,048 B2 * | 12/2002 | Morita | 438/22 |
| 6,795,471 B2 * | 9/2004 | Watanabe et al. | 372/46.01 |
| 2004/0094773 A1 * | 5/2004 | Kiyoku et al. | 257/103 |
| 2005/0167836 A1 * | 8/2005 | Tomiya et al. | 257/744 |
| 2005/0265412 A1 * | 12/2005 | Ueki | 372/43.01 |

* cited by examiner

*Primary Examiner* — Cuong Q Nguyen
*Assistant Examiner* — Cathy N Lam
(74) *Attorney, Agent, or Firm* — Kile Park Goekjian Reed & McManus PLLC

(57) ABSTRACT

Provided is a side light emitting type semiconductor laser diode in which a dielectric layer is formed on an active layer. The side light emitting type semiconductor laser diode includes an n-clad layer, an n-light guide layer, an active layer and a p-light guide layer sequentially formed on a substrate, and a dielectric layer with a ridge structure formed on the p-light guide layer.

10 Claims, 6 Drawing Sheets

SIDE LIGHT EMITTING TYPE SEMICONDUCTOR LASER DIODE HAVING DIELECTRIC LAYER FORMED ON ACTIVE LAYER

CROSS-REFERENCE TO RELATED PATENT APPLICATION

This application claims the benefit of Korean Patent Application No. 10-2005-0096159, filed on Oct. 12, 2005, in the Korean Intellectual Property Office, the disclosure of which is incorporated herein in its entirety by reference.

BACKGROUND OF THE DISCLOSURE

1. Field of the Disclosure

The present disclosure relates to a semiconductor laser diode, and more particularly, to a side light emitting type semiconductor laser diode including a dielectric layer formed on an active layer, and a p-conductive layer supplying current to both sides of the dielectric layer and a method of manufacturing the same.

2. Description of the Related Art

Semiconductor laser diodes, currently used in light sources of various information processing apparatuses, require high light extraction efficiency versus an applied electric power to increase information density. Accordingly, research into the optimization of the structure of a laser diode has been conducted.

FIG. 1 is a cross-sectional view of a conventional semiconductor laser diode. Referring to FIG. 1, an n-AlGaN layer 11 is formed on a substrate 10 and an n-AlGaN clad layer 12, an InGaN active layer 13 having a Multi Quantum Wall (MQW) structure, a p-AlGaN clad layer 14, a p-contact layer 15 and a p-electrode layer 16 are sequentially formed on the n-AlGaN layer 11. In addition, an n-electrode layer 17 is formed on the region of the n-AlGaN layer 11 in a region where the n-AlGaN clad layer 12 is not formed.

In order to form the semiconductor laser diode illustrated in FIG. 1, the n-AlGaN clad layer 12, the InGaN MQW active layer 13, the p-AlGaN clad layer 14, the p-contact layer 15 and the p-electrode layer 16 are sequentially formed on the n-AlGaN layer 11. Then, semiconductor materials are removed from the region of the n-AlGaN layer 11 where the n-electrode layer 17 is to be formed to expose the n-AlGaN layer 11, and then the n-electrode layer 17 is formed.

The conventional semiconductor laser diode illustrated in FIG. 1 has the following problems.

First, in the process of forming the semiconductor laser diode shown in FIG. 1, while heat-treatment of the p-AlGaN clad layer 14 is performed at a high temperature in a growth process, segregation of indium (In) grown at a low temperature is performed in the InGaN active layer 13 and thus, the quality of the MQW structure of the InGaN active layer 13 may decline.

Second, doping materials using p-type impurities, for example, Mg, may cause a lattice defect of the p-AlGaN clad layer 14, and thus optical loss is increased.

Third, due to diffusion of Mg in the p-AlGaN clad layer 14, the quality of the MQW structure in the InGaN active layer 13 may decline.

SUMMARY OF THE DISCLOSURE

The present disclosure provides a semiconductor laser diode having a dielectric layer instead of a p-clad layer formed on an active layer to improve optical characteristics of the semiconductor laser diode.

According to an aspect of the present disclosure, there is provided a side light emitting type semiconductor laser diode including: a substrate; an n-clad layer disposed on the substrate; an n-light guide layer disposed on the n-clad layer; an active layer disposed on the n-light guide layer; a p-light guide layer disposed on the active layer; and a dielectric layer with a ridge structure directly in contact with the p-light guide layer and/or without the laser diode having a p-clad layer.

A p-contact layer may be interposed between the p-light guide layer and the dielectric layer.

A p-electrode layer may be disposed on the sides of the dielectric layer.

An n-semiconductor layer may be interposed between the substrate and the n-clad layer and an n-electrode layer may be disposed on one portion of the n-semiconductor layer.

A current restriction region may be disposed on sides of the p-light guide layer.

A current restriction region may be disposed on the upper surface of the p-light guide layer to restrict a current applied to the active layer.

A current diffusion layer may be interposed between the p-light guide layer and the p-contact layer.

The n-clad layer may be formed of $Al_xGaN$ ($x \geq 0$). The n-light guide layer may be formed of $In_xGaN$ ($x \geq 0$). The active layer may have a Multi Quantum Wall (MQW) structure formed of $In_xGaN$ ($x \geq 0$). The p-light guide layer may be formed of $In_xGaN$ ($x \geq 0$).

The dielectric layer may include at least one material selected from the group consisting of $SiO_2$, $SiN_x$, $HfO_x$, AlN, $Al_2O_3$, $TiO_2$, $ZrO_2$, MnO, and $Ta_2O_5$.

The p-contact layer may be formed of $In_xGaN$ ($x \geq 0$).

The current restriction layer may be formed of one of undoped-AlGaN and p-AlGaN and the current diffusion layer may be formed of AlGaN.

BRIEF DESCRIPTION OF THE DRAWINGS

The above and other features and advantages of the present disclosure will become more apparent by describing in detail exemplary embodiments thereof with reference to the attached drawings in which.

DETAILED DESCRIPTION OF THE DISCLOSURE

Figure 1:
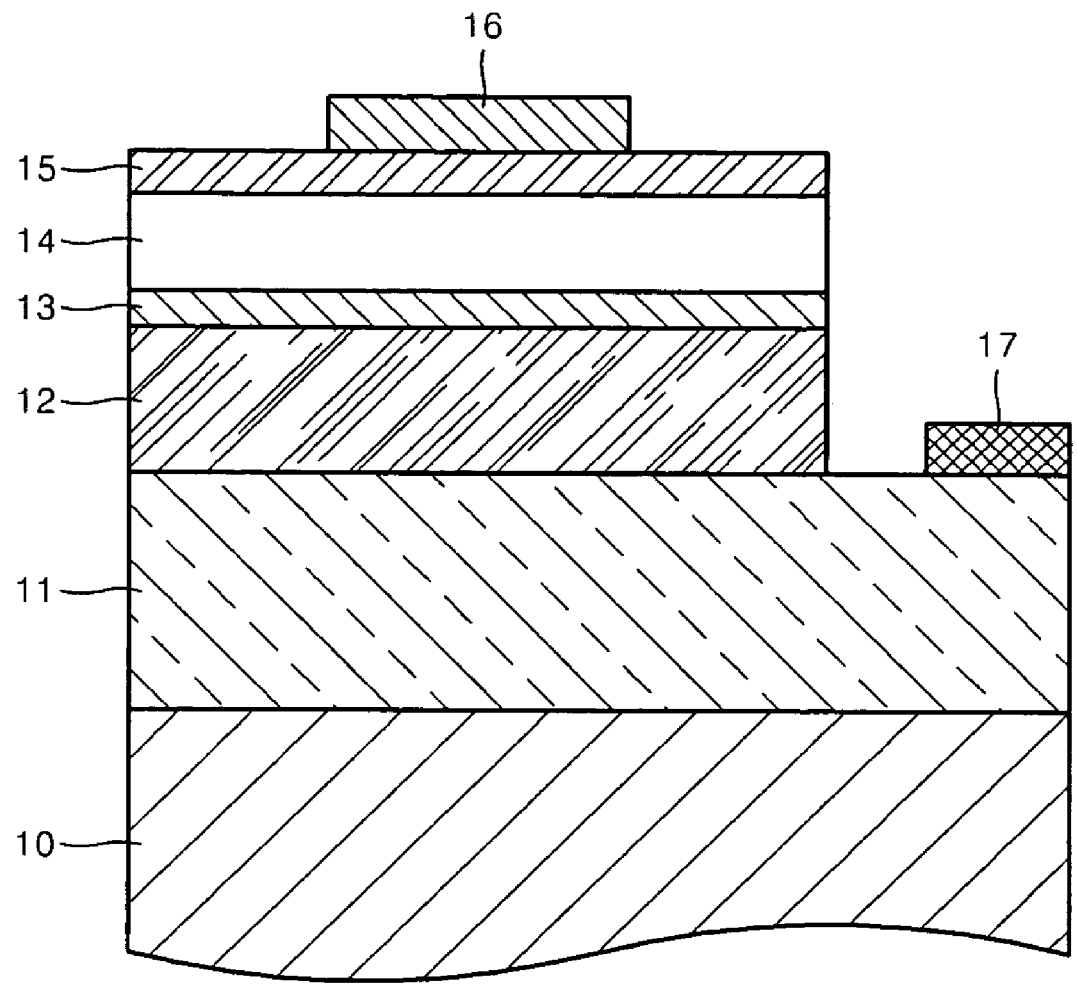
FIG. 1 is a cross-sectional view of a conventional semiconductor laser diode.

The present disclosure will now describe more fully, with reference to the accompanying drawings, exemplary embodiments of the disclosure. The claimed invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. Like reference numerals in the drawings denote like elements, and thus their descriptions will not be repeated.

Figure 2:
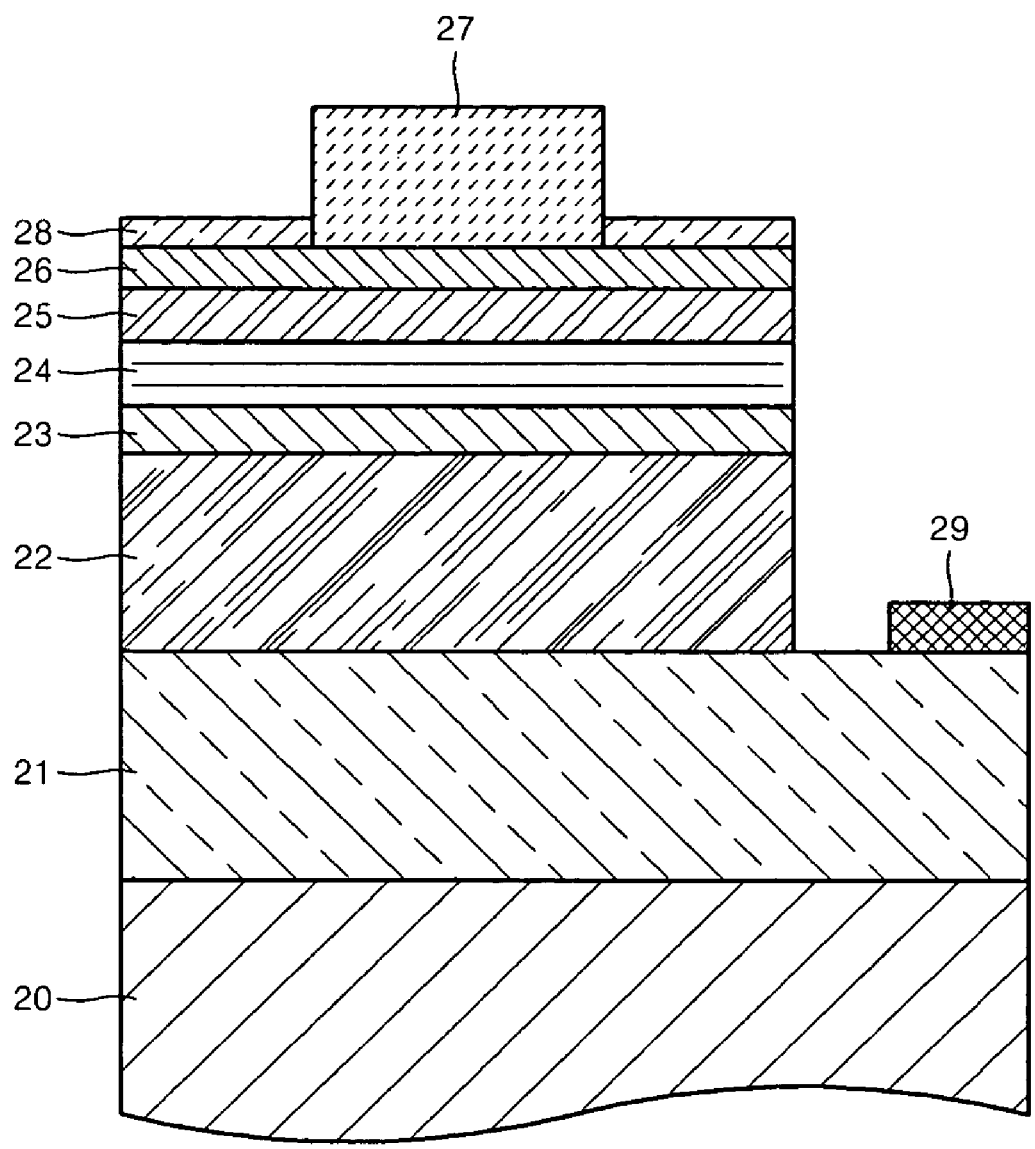
FIG. 2 is a cross-sectional view of a semiconductor laser diode having a dielectric layer formed on an active layer according to an embodiment of the present disclosure.

FIG. 2 is a cross-sectional view of a side light emitting type semiconductor laser diode in which a dielectric layer 27 is formed on an active layer according to an embodiment of the present disclosure.

Referring to FIG. 2, an n-semiconductor layer 21 is formed on a substrate 20 and an n-clad layer 22, an n-light guide layer 23, an active layer 24 and a p-light guide layer 25 are sequentially formed on the n-semiconductor layer 21. Optionally, a p-contact layer 26 can be further formed on the p-light guide layer 25. In addition, the dielectric layer 27 is formed on a central region of the p-light guide layer 25 or the p-contact layer 26, and a p-electrode layer 28 is formed at the sides of the dielectric layer 27. An n-electrode layer 29 is formed on the remaining portion of the n-semiconductor layer 21 where the n-clad layer 22 is not formed.

The n-semiconductor layer 21 and the n-clad layer 22 can respectively be formed of $Al_xGaN$ ($x \geq 0$). The n-light guide layer 23 can be formed of $In_xGaN$ ($x \geq 0$) and the active layer 24 can have a Multi Quantum Wall (MQW) structure and be formed of $In_xGaN$ ($x \geq 0$). The p-light guide layer 25 can be formed of $In_xGaN$ ($x \geq 0$) and the p-contact layer 26 can be formed of $In_xGaN$ ($x \geq 0$).

In an embodiment of the present disclosure, the dielectric layer 27 has a ridge structure on the p-light guide layer 25 or the p-contact layer 26, and is formed of a dielectric material such as $SiO_2$, $SiN_x$, $HfO_x$, AlN, $Al_2O_3$, $TiO_2$, $ZrO_2$, MnO or $Ta_2O_5$. The dielectric layer 27 plays a role in guiding the light mode generated in the active layer 24 by the current supplied to the p-electrode layer 28 and the n-electrode layer 29. In order to oscillate the laser, the current supplied to the active layer 24 is supplied through the p-electrode layer 28 formed on both sides of the dielectric layer 27.

To increase the efficiency of the supply of current, a current restriction region can be formed on the p-light guide layer 25 or the n-light guide layer 23. This is described below with reference to FIGS. 3A through 3B.

Figure 3A:
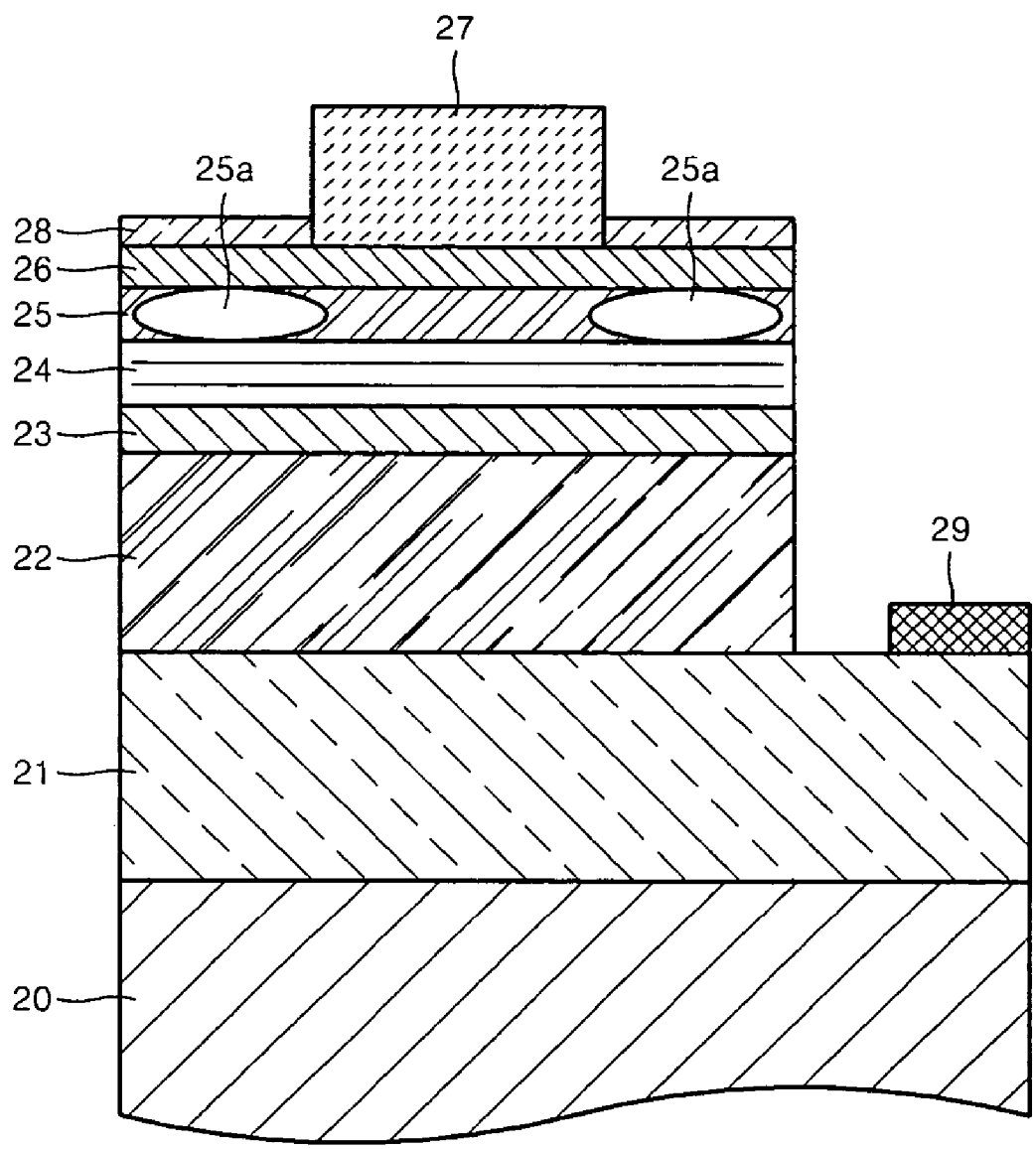
FIG. 3A is a cross-sectional view of a laser diode according to an embodiment of the present disclosure in which a current restriction region is formed on a p-light guide layer.

FIG. 3A is a cross-sectional view of a laser diode according to an embodiment of the present disclosure in which current restriction regions 25a are formed in the p-light guide layer 25. Referring to FIG. 3A, the n-semiconductor layer 21 is formed on the substrate 20 and the n-clad layer 22, and the n-light guide layer 23, the active layer 24 and the p-light guide layer 25 are sequentially formed on the n-semiconductor layer 21. Optionally, the p-contact layer 26 can be further formed on the p-light guide layer 25. In addition, the dielectric layer 27 is formed on the central region of the p-light guide layer 25 or the p-contact layer 26, and the p-electrode layer 28 is formed at the sides of the dielectric layer 27. The n-electrode layer 29 is formed on the remaining portion of the n-semiconductor layer 21 where the n-clad layer 22 is not formed. The structure herein is the same as the basic structure illustrated in FIG. 2. However, in FIG. 3A, the current restriction regions 25a are further formed in the p-light guide layer 25.

The current restriction regions 25a are formed by injecting a material such as H, B or $NH_3$ into both sides of the p-light guide layer 25 using implantation when the p-light guide layer 25 is formed. When the p-light guide layer 25 is optionally formed, p-type impurities can be doped in the region excluding the current restriction regions 25a. Thus, if the current is supplied through the p-contact layer 28 formed on both sides of the dielectric layer 27, the current passes through a space between the current restriction regions 25a of the p-light guide layer 25, instead of through the current restriction regions 25a themselves, and then reach the active layer 24. Consequentially, the current is mainly supplied to the central region of the active layer 24, and thus efficient laser oscillation can occur.

Moreover, if the current restriction regions 25a are formed on both portions of the n-light guide layer 23, the current can be supplied mainly to the central region of the active layer 24. That is, if the material such as H, B or $NH_3$ is injected into both sides of the p-light guide layer 25 using implantation, or the n-light guide layer 23 is optionally formed, n-type impurities can be doped in the region excluding the current restriction regions 25a.

Figure 3B:
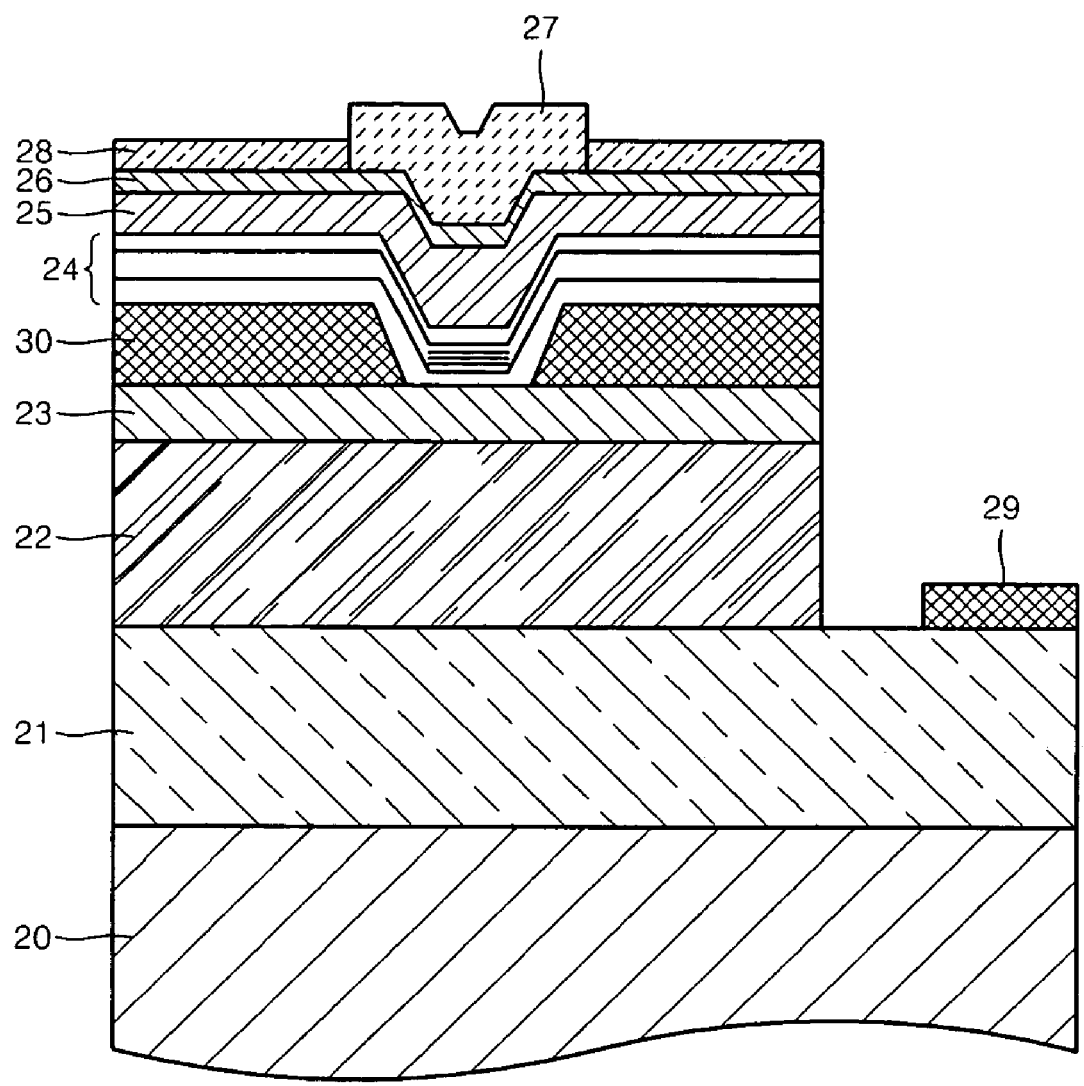
FIG. 3B is a cross-sectional view of a laser diode according to an embodiment of the present disclosure in which a current restriction layer is formed on the structure illustrated in FIG. 3A.

FIG. 3B is a cross-sectional view of a laser diode including a current restriction layer 30. Referring to FIG. 3B, the current restriction layer 30 is formed between the n-light guide layer 23 and the active layer 24 to restrict the route of the current supplied from the n-electrode layer 29, instead of forming the current restriction regions in the n-light guide layer 25. In detail, after forming the n-light guide layer 23, undoped AlGaN or p-AlGaN is supplied to the upper surface of the n-light guide layer 23 and the n-light guide layer 23 is exposed by etching the central region of the undoped AlGaN or AlGaN. Then, the active layer 24 and the p-light guide layer 25 are sequentially formed on the upper surface of the etched region. Consequently, the active layer 24 is grooved. Accordingly, the current supplied by the n-electrode layer 29 cannot pass through the current restriction layer 30, and thus the current is supplied mainly to the central region of the active layer 24 through the space formed in the current restriction layer 30. Thus, efficient laser oscillation can occur.

Figure 4:
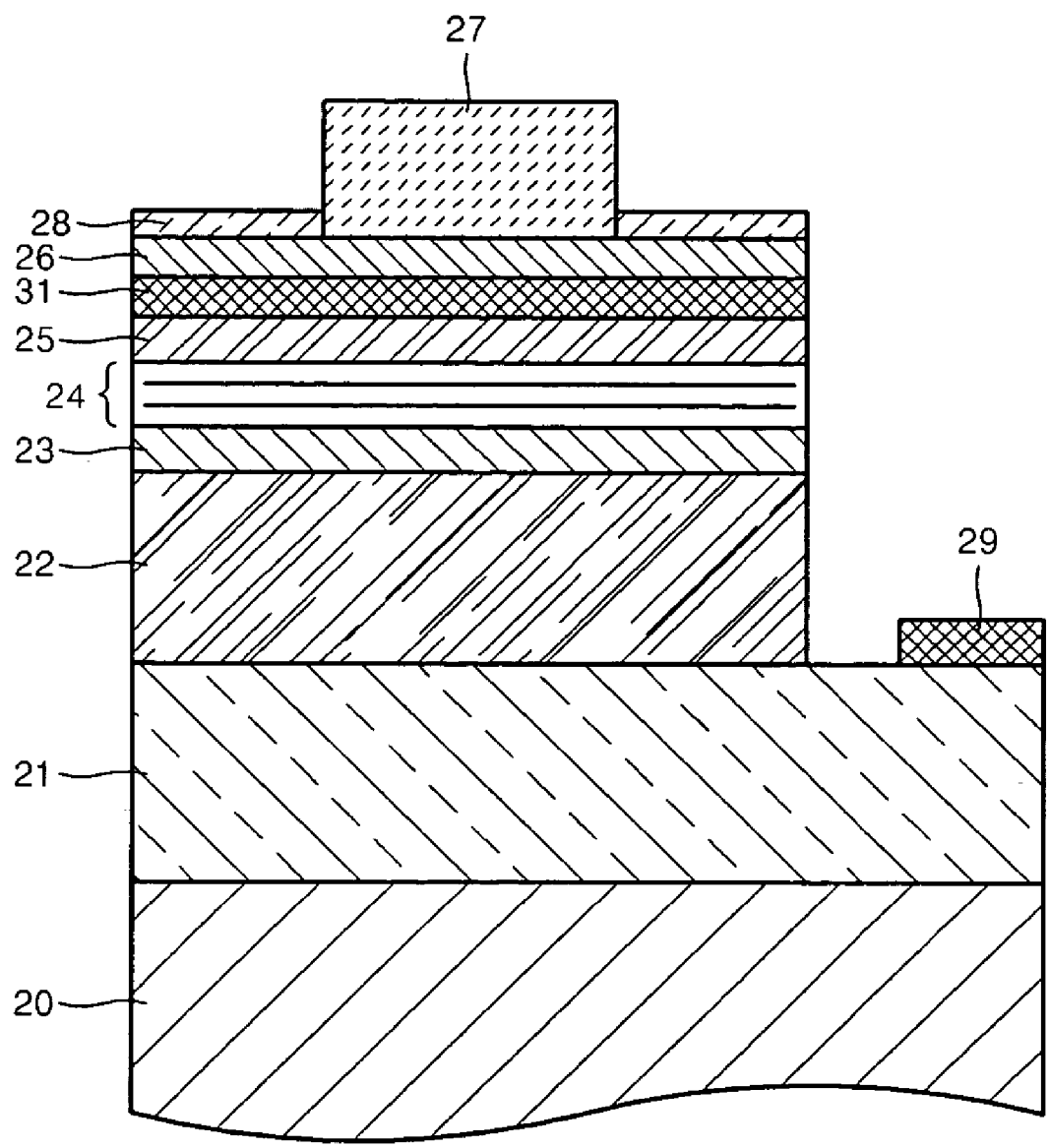
FIG. 4 is a cross-sectional view of a laser diode including a current diffusion layer on the p-light guide layer in the basic structure illustrated in FIG. 2.

FIG. 4 is a cross-sectional view of a laser diode including a current diffusion layer 31 on the p-light guide layer 25 in the basic structure illustrated in FIG. 2.

Referring to FIG. 4, the n-semiconductor layer 21 is formed on the substrate 20 and the n-clad layer 22, the n-light guide layer 23, the active layer 24, the p-light guide layer 25 and the current diffusion layer 31 are sequentially formed on the n-semiconductor layer 21. Optionally, the p-contact layer 26 can be further formed on the current diffusion layer 31. In addition, the dielectric layer 27 is formed on the central region of the p-light guide layer 25 or the p-contact layer 26, and the p-electrode layer 28 is formed at the sides of the dielectric layer 27. The n-electrode layer 29 is formed on the remaining portion of the n-semiconductor layer 21 where the n-clad layer 22 is not formed. The current diffusion layer 31 can be formed of AlGaN, and the current supplied through the p-electrode layer 28 is supplied to the active layer 24 through the current diffusion layer 31. The current diffusion layer 31 is thin (approximately 100 nm), and a process of high temperature oxidation is either unnecessary or performed for a very short time. Accordingly, the quality of the MQW structure in segregation of indium (In) of the active layer 24 may not decline.

Figure 5:
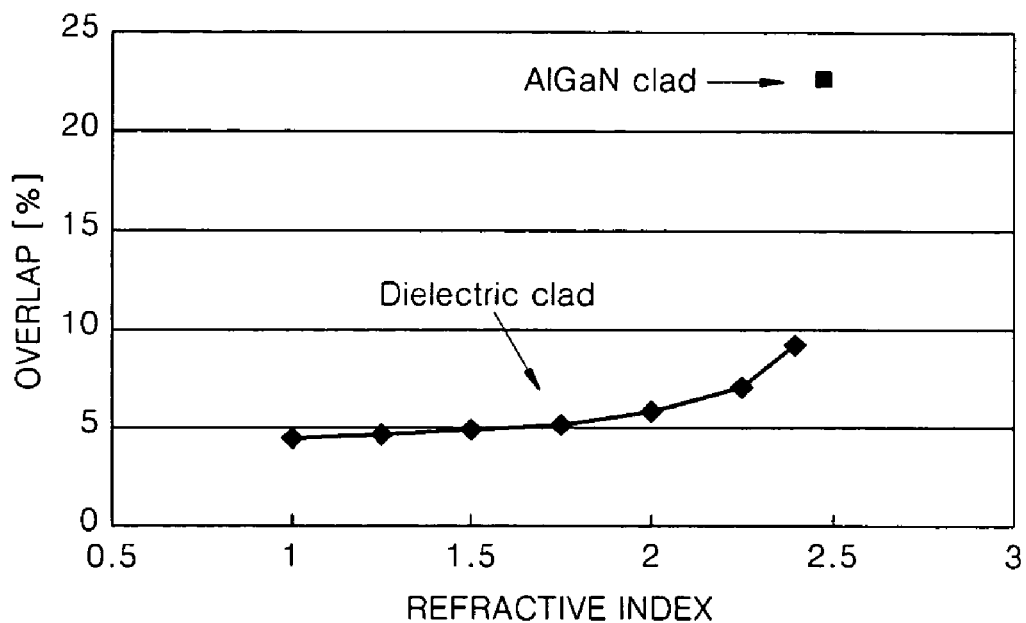
FIG. 5 is a graph of the result of a simulation showing an overlapping ratio of a dielectric layer and a laser light mode oscillating in an active layer of the semiconductor laser diode of an embodiment of the present disclosure and a p-clad layer and a laser light mode oscillating in an active layer of a conventional semiconductor laser diode.

Hereinafter, the laser diode of an embodiment of the present disclosure and a conventional laser diode will be compared with reference to FIG. 5. FIG. 5 is a graph of the result of a simulation showing an overlapping ratio of a dielectric layer and a laser light mode oscillating in an active layer of the semiconductor laser diode of an embodiment of the present disclosure and a p-clad layer and a laser light mode oscillating in an active layer of a conventional semiconductor laser diode. In a conventional laser diode, AlGaN is used for the p-clad layer and the refractive index of the p-clad layer is about 2.5. Referring to FIG. 5, when the laser beam that oscillated in the active layer was transmitted toward the sides of the active layer, the overlapping ratio of the light mode to the p-clad layer, which was doped with Mg as a p-type impurity, was over 20%, and thus optical loss was low.

In addition, in the laser diode structure illustrated in FIG. 3A, the overlapping ratio of the dielectric layer to the laser oscillated in the active layer was investigated by using materials with different refractive indexes to form the dielectric layer. It was found that the overlapping ratio was less than 10% even when the dielectric layer was formed of a material with a refractive index of 2.5. Consequently, the laser diode structure of an embodiment of the present disclosure showed a greater decrease in optical loss than that of the conventional art.

Figure 6:
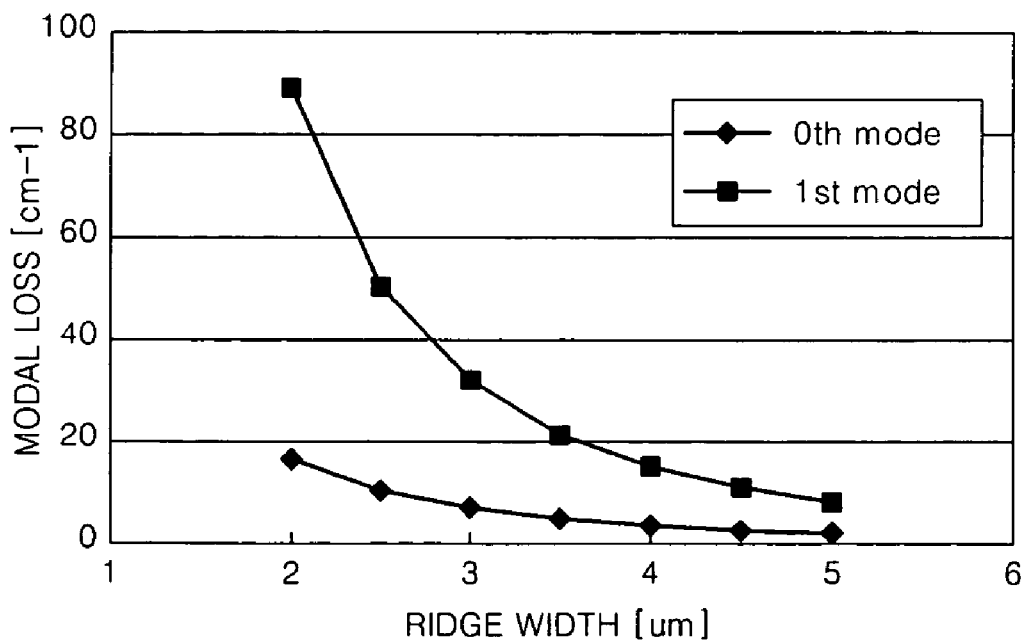
FIG. 6 is a graph of modal loss according to ridge width of a dielectric layer having a ridge structure in a semiconductor laser diode according to an embodiment of the present disclosure.

FIG. 6 is a graph of modal loss according to ridge width of a dielectric layer having a ridge structure in a semiconductor laser diode according to an embodiment of the present disclosure. FIG. 6 shows the results for a fundamental mode ($0^{th}$ mode) and a 1st-order mode of an oscillated laser. In the semiconductor laser diode according to an embodiment of the present disclosure illustrated in FIG. 2, the optical loss occurs in the p-electrode layer 28, which is formed of a metal material at the sides of the dielectric layer 27 having the ridge structure. When the width of the dielectric layer 27 is less than approximately 2 μm, the modal loss of the fundamental mode is small, below 20 cm$^{-1}$. On the other hand, since the loss of the 1st-order mode is high, a high kink level exists due to the efficiency of the mode selection. Thus, the laser oscillated in the active layer can be easily emitted as a single transverse mode laser.

The semiconductor laser diode of the present disclosure has the following advantages.

First, a characteristic decline of the active layer which may occur in the growth process of the p-clad layer at a high temperature can be prevented.

Second, optical loss due to diffusion of Mg, the p-type doping material, can be prevented.

Third, the material constituting the dielectric layer can be selected according to its refractive index.

Fourth, using a difference between the optical losses of the fundamental mode of the oscillated laser in a metal contact and the 1st-order mode, an oscillation of high order mode laser can be controlled.

While the present disclosure has been particularly shown and described with reference to exemplary embodiments thereof, it will be understood by those of ordinary skill in the art that various changes in form and details may be made therein without departing from the spirit and scope of the present disclosure as defined by the following claims.

What is claimed is:

1. A side light emitting type semiconductor laser diode comprising:
   a substrate;
   an n-clad layer disposed on the substrate;
   an n-light guide layer disposed on the n-clad layer;
   an active layer disposed on the n-light guide layer;
   a p-light guide layer disposed on the active layer; and
   a dielectric layer with a ridge structure disposed directly on the p-light guide layer,
   wherein the p-light guide layer and the dielectric layer are sequentially disposed on the active layer, and
   wherein the dielectric layer is located directly above a light mode generation region of the active layer.

2. A side light emitting type semiconductor laser diode comprising:
   a substrate;
   an n-clad layer disposed on the substrate;
   an n-light guide layer disposed on the n-clad layer;
   an active layer disposed on the n-light guide layer;
   a p-light guide layer disposed on the active layer;
   a p-contact layer directly disposed on the p-light guide layer; and
   a dielectric layer with a ridge structure directly disposed on the p-contact layer.

3. The side light emitting type semiconductor laser diode of claim 2, further comprising a p-electrode layer disposed on sides of the dielectric layer.

4. The side light emitting type semiconductor laser diode of claim 1, further comprising:
   an n-semiconductor layer interposed between the substrate and the n-clad layer; and
   an n-electrode layer disposed on one portion of the n-semiconductor layer.

5. The side light emitting type semiconductor laser diode of claim 1, wherein the n-clad layer is formed of $Al_xGaN$ ($x \geq 0$).

6. The side light emitting type semiconductor laser diode of claim 1, wherein the n-light guide layer is formed of $In_xGaN$ ($x \geq 0$).

7. The side light emitting type semiconductor laser diode of claim 1, wherein the active layer has a Multi Quantum Wall (MQW) structure formed of $In_xGaN$ ($x \geq 0$).

8. The side light emitting type semiconductor laser diode of claim 1, wherein the p-light guide layer is formed of $In_xGaN$ ($x \geq 0$).

9. The side light emitting type semiconductor laser diode of claim 1, wherein the dielectric layer includes at least one material selected from the group consisting of $SiO_2$, $SiN_x$, $HfOx$, $AlN$, $Al_2O_3$, $TiO_2$, $ZrO_2$, $MnO$, and $Ta_2O_5$.

10. The side light emitting type semiconductor laser diode of claim 2, wherein the p-contact layer is formed of $In_xGaN$ ($x \geq 0$).

* * * * *